United States Patent [19]

Jahnes et al.

[11] Patent Number: 5,569,506

[45] Date of Patent: Oct. 29, 1996

[54] MAGNETIC RECORDING DISK AND DISK DRIVE WITH IMPROVED HEAD-DISK INTERFACE

[75] Inventors: Christopher V. Jahnes, Monsey, N.Y.; James H. Kaufman, San Jose, Calif.; Serhat Metin, San Jose, Calif.; Mohammad T. Mirzamaani, San Jose, Calif.; Anthony W. Wu, San Jose, Calif.

[73] Assignee: International Business Machines Corporation, Armonk, N.Y.

[21] Appl. No.: 132,543

[22] Filed: Oct. 6, 1993

[51] Int. Cl.⁶ .................. B32B 3/02; G11B 5/66; B32P 9/00

[52] U.S. Cl. .......... 428/65.3; 428/65.4; 428/65.5; 428/141; 428/336; 428/408; 428/694 T; 428/694 TP; 428/694 TC; 428/695; 428/900; 360/133; 360/135; 360/900

[58] Field of Search .................. 428/695, 694 T, 428/694 TP, 694 TC, 336, 408, 900, 141, 65.3, 65.4, 65.5; 360/133, 135, 900

[56] References Cited

U.S. PATENT DOCUMENTS

| | | | |
|---|---|---|---|
| 4,778,582 | 10/1988 | Howard | 204/192.15 |
| 5,029,317 | 7/1991 | Kawai et al. | 360/131 |
| 5,030,494 | 7/1991 | Ahlert et al. | 428/65.5 |
| 5,053,250 | 10/1991 | Baseman et al. | 427/131 |
| 5,159,508 | 10/1992 | Grill et al. | 360/103 |
| 5,266,409 | 11/1993 | Schmidt | 428/446 |
| 5,275,850 | 1/1994 | Kitoh | 427/577 |

OTHER PUBLICATIONS

Cheng et al., "Disk with Patterned Overcoat and Flat Magnetic Underlayer", IBM Technical Disclosure Bulletin, vol. 32, No. 5B, Oct. 1989, p. 264.

Kaufman et al., "Symmetry Breaking in Nitrogen-doped Amorphous Carbon: Infrared Observation of the Raman-active G and D Bands", Physical Review B: Condensed Matter, 3rd Series, vol. 39, No. 18, Jun. 15, 1989, pp. 13053-13060.

Tsai et al., "Structure and Properties of Sputtered Carbon Overcoats on Rigid Magnetic Media Disks", Journal of Vacuum Science technology, vol. A6, No. 4, Jul./Aug. 1988, pp. 2307-2315.

*Primary Examiner*—Leszek Kiliman
*Attorney, Agent, or Firm*—Thomas R. Berthold

[57] ABSTRACT

A thin film metal alloy magnetic recording disk has an improved protective overcoat that creates a low level of static friction in a contact start/stop disk drive. The disk has an amorphous carbon overcoat containing a transition liquid metal interlayer (TLMI). The carbon overcoat is formed by depositing an initial amorphous carbon layer to a first thickness, then depositing an interlayer material of a low-melting point metal or metal alloy (such as In or In—Nb) while maintaining the temperature of the disk substrate above the melting point of the interlayer material, and then depositing a top additional layer of amorphous carbon. Because the initial carbon layer presents a nonwetting surface, the interlayer material "balls up" on the carbon and forms discontinuous spheres of the interlayer material. The additional top layer of carbon bonds to the initial carbon layer and to the metal or metal alloy spheres. The completed disk protective overcoat presents a continuous but textured surface of amorphous carbon for the head-disk interface in the disk drive.

8 Claims, 3 Drawing Sheets

MAGNETIC RECORDING DISK AND DISK DRIVE WITH IMPROVED HEAD-DISK INTERFACE

TECHNICAL FIELD

This invention relates to a magnetic recording disk, and in particular to a disk having a textured protective overcoat. The invention also relates to a rigid disk drive incorporating such a disk and having an improved head-disk interface.

BACKGROUND OF THE INVENTION

In one type of rotating magnetic recording rigid disk drives, each of the read/write transducers (or heads) is supported on a carrier (or slider) which rides on a cushion or bearing of air above the surface of its associated disk when the disk is rotating at its operating speed. The slider has an air-bearing surface (ABS), typically in the form of a plurality of rails, and is connected to a linear or rotary actuator by means of a relatively fragile suspension. There may be a stack of disks in the disk drive with the actuator supporting a number of sliders. The actuator moves the sliders radially so that each head may access the recording area of its associated disk surface.

The slider in this conventional disk drive is biased toward the disk surface by a small force from the suspension. The ABS of the slider is thus in contact with the disk surface from the time the disk drive is turned on until the disk reaches a speed sufficient to cause the slider to ride on the air bearing. The ABS of the slider is again in contact with the disk surface when the disk drive is turned off and the rotational speed of the disk falls below that necessary to create the air bearing. This type of disk drive is called a contact start/stop (CSS) disk drive. To provide wear resistance for the ABS in a CSS disk drive, a protective overcoat may be placed on the slider rails. U.S. Pat. No. 5,159,508, assigned to IBM, describes a slider with air-bearing rails having an amorphous carbon overcoat that is adhered to the rails by a silicon adhesion layer.

The magnetic recording disk in a CSS rigid disk drive is typically a thin film disk comprising a substrate, such as a disk blank made of glass or an aluminum-magnesium (AlMg) alloy with a nickel-phosphorous (NIP) surface coating, and a cobalt-based magnetic alloy film formed by sputter deposition over the substrate. A protective overcoat, such as a sputter-deposited amorphous carbon film, is formed over the magnetic layer to provide corrosion resistance and wear resistance from the ABS of the slider. A liquid fluorether lubricant is also maintained on the surface of the protective disk overcoat to prevent damage to the head and the disk during starting and stopping of the disk. Typically, the lubricant used on disks with carbon overcoats is made up of a first layer of lubricant which is bonded to the carbon and a second layer of free or mobile lubricant on top of the bonded lubricant.

Protective carbon overcoats for thin film disks and slider air-bearing surfaces are well known. They are typically formed by sputter deposition from a graphite target, and are generally called protective carbon overcoats, "diamondlike" carbon overcoats, amorphous carbon overcoats, or, in the case of those overcoats formed by sputter deposition in the presence of a hydrogen-containing gas, hydrogenated carbon overcoats. Tsai, et al. in "Structure and Properties of Sputtered Carbon Overcoats on Rigid Magnetic Media Disks," *J. Vac. Science Technology* A6(4), July/August 1988, pp. 2307–2314, describe such protective carbon overcoats and refer to them as amorphous "diamondlike" carbon films, the "diamondlike" referring to their hardness rather than their crystalline structure. U.S. Pat. No. 4,778,582, assigned to IBM, describes a protective hydrogenated disk carbon overcoat formed by sputtering a graphite target in the presence of Ar and hydrogen ($H_2$). The carbon overcoats may also be formed by plasma-enhanced chemical vapor deposition (CVD) and may include nitrogen in addition to hydrogen, as described by Kaufman et al., *Phys. Rev. B*, Vol. 39, p. 13053 (June 1989).

In addition to the magnetic layer and the protective overcoat, the thin film disk may also include a sputter-deposited underlayer, such as a layer of chromium (Cr) or a chromium-vanadium (CrV) alloy, between the substrate and the magnetic layer and a sputter-deposited adhesion layer, such as a Cr, tungsten (W) or titanium (Ti) layer, between the magnetic layer and the protective overcoat.

To improve the wear resistance of the disk, as well as to maintain consistent magnetic properties, it is desirable to make the disk surface as smooth as possible. However, a very smooth disk surface in a CSS disk drive creates what is called "stiction". This means that after the slider ABS has been in stationary contact with the disk for a period of time, the slider tends to resist translational movement or "stick" to the disk surface. It is known that this "stiction" force can increase over time. Thus, the stiction force measured relatively soon after a CSS cycle is called "CSS stiction", while that measured several hours after a CSS cycle is called "rest stiction". Stiction is caused by a variety of factors, including static friction and adhesion forces between the disk and slider created by the lubricant or by capillary condensation of atmospheric water vapor. Stiction in a CSS disk drive can result in damage to the head or disk when the slider suddenly breaks free from the disk surface when disk rotation is initiated. Because the suspension between the actuator and the slider is relatively fragile in order to permit the slider to fly above the disk surface, sudden rotation of the disk can also damage the suspension.

To avoid the stiction problem associated with CSS disk drives, some disk drives are of the "load/unload" type. In this type of drive, the slider is mechanically unloaded from the disk, typically by means of a ramp that contacts the suspension when the actuator is retracted at power down, and then loaded back to the disk when power is turned on and the disk has reached a speed sufficient to generate the air bearing. Even in load/unload disk drives, however, stiction can be a problem in the event of failure of the load/unload system.

The more common solution to the stiction problem is to texture the disk. Typically, this is done by abrasive polishing of the disk substrate, which results in a texturing of the conforming layers deposited over the substrate. Thus, the carbon overcoat will reflect the texture placed on the substrate and reduce the stiction when the slider is resting on the disk carbon overcoat. However, texturing of the substrate adds to the disk manufacturing cost and complexity because it cannot be done in-situ in the conventional sputter deposition process chambers. U.S. Pat. No. 5,053,250, assigned to IBM, describes an in-situ process for forming a textured underlayer on the disk substrate. The '250 patent teaches the use of a metal material which, due to the heating of the disk substrate, is sputter deposited on the substrate as discontinuous liquid spheres. The subsequently deposited magnetic layer and carbon overcoat follow this discontinuous topology, resulting in a textured surface at the head-disk interface. Texturing of the entire disk substrate, whether by abrasive polishing or an in-situ process, has the additional disadvantage that the magnetic properties of the magnetic layer are degraded because the crystalline growth of the magnetic layer is adversely affected. This increases the data error rate in the disk drive. To avoid this problem, the texturing of the disk substrate may be limited to a nondata band, called the landing zone, where the slider is moved when the disk drive is stopped. The landing zone, which adds to the complexity of the drive electronics, is required to prevent the substrate texturing from adversely affecting the magnetic properties of the disk in the data region.

As an alternative to texturing the substrate, texturing of the disk protective overcoat has been suggested. This can be accomplished by mechanical processes, such as abrasive polishing, or by chemical or laser etching, as described in *IBM Technical Disclosure Bulletin*, October 1989, p. 264. Another type of overcoat "texturing", as described in U.S. Pat. No. 5,030,494, assigned to IBM, involves cosputtering the carbon with other material additives, such as tungsten carbide, to form clusters of the additives that project above the relatively smooth carbon overcoat surface and present a discontinuous head-disk interface. These types of prior disk overcoat texturing techniques either involve additional complex and costly ex-situ process steps or result in an overcoat which is not the preferred continuous film of amorphous carbon.

What is needed is a thin film magnetic recording disk with a continuous textured protective overcoat formed by a conventional in-situ process. The disk overcoat must reduce stiction, be wear resistant, and not affect the magnetic recording performance of the disk drive.

SUMMARY OF THE INVENTION

The invention is a thin film metal alloy magnetic recording disk having an improved protective overcoat that creates a low level of stiction in a CSS disk drive. In the preferred embodiment, the disk has an amorphous carbon overcoat containing a transient liquid metal interlayer (TLMI). The carbon overcoat is formed by depositing an initial amorphous carbon layer to a first thickness, then depositing an interlayer material of a low-melting point metal or metal alloy while maintaining the temperature of the disk substrate above the melting point of the interlayer material, and then depositing a top additional layer of amorphous carbon. Because the initial carbon layer presents a nonwetting surface, the interlayer material "balls up" on the carbon and forms discontinuous rounded or generally spherically-shaped grains of the interlayer material. The additional top layer of carbon bonds to the initial carbon layer and to the metal or metal alloy spheres. The completed disk protective overcoat presents a continuous but textured surface of amorphous carbon for the head-disk interface in the disk drive. Thus, the present invention is also directed to a rigid disk drive wherein the thin film metal alloy disks have the above-described protective overcoat.

For a fuller understanding of the nature and advantages of the present invention, reference should be made to the following detailed description taken in conjunction with the accompanying figures.

DETAILED DESCRIPTION OF THE INVENTION

Prior Art

Figure 1:
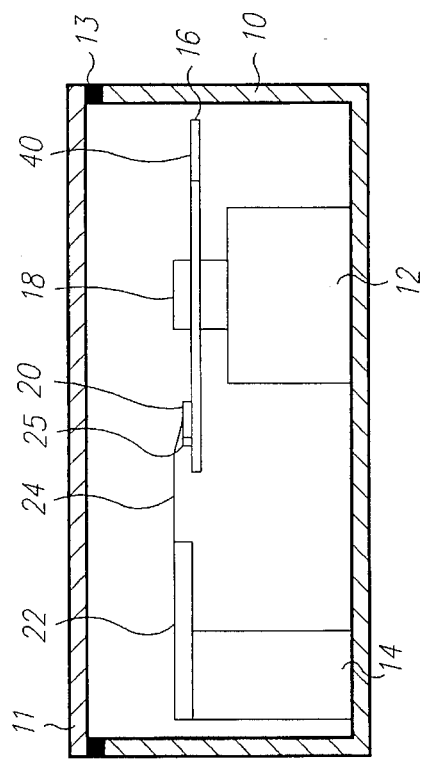
FIG. 1 is a view in section of a schematic of a prior art CSS disk drive.

Referring to FIG. 1, there is illustrated in sectional view a schematic of a prior art CSS disk drive. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment.

A magnetic recording disk 16 is connected to drive motor 12 by means of hub 18 to which it is attached for rotation by the drive motor 12. A thin continuous lubricant film 40 is maintained on the surface of disk 16. The prior art disk 16 typically comprises a disk blank of a AlMg alloy having a textured NiP surface coating. The texturing of the substrate, which is done by abrasive polishing of the NiP coating, causes the subsequently deposited underlayer, magnetic layer, and protective overcoat to conform to the underlayer so that the overcoat presents a textured surface at the head-disk interface. Typically in CSS disk drives, the substrate is textured only in a nondata region referred to as the landing zone, where the slider 20 is moved when the disk drive is stopped.

A read/write head or transducer 25 is formed on the trailing end of a carrier, such as an air-bearing slider 20. Transducer 25 may be an inductive read and write transducer or an inductive write transducer with a magnetoresistive (MR) read transducer. The slider 20 is connected to the actuator 14 by means of a rigid arm 22 and a suspension 24. The suspension 24 provides a biasing force which urges the slider 20 onto the surface of the recording disk 16.

During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head may access different data tracks on disk 16.

Figure 2:
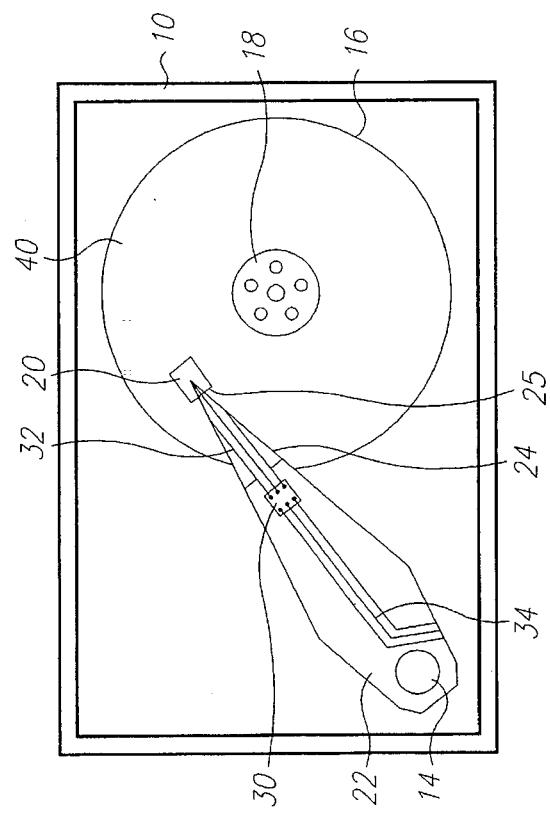
FIG. 2 is an open top view of the prior art disk drive depicted schematically in FIG. 1.

FIG. 2 is a top view of the interior of the disk drive with the cover 11 removed, and illustrates in better detail the suspension 24 which provides a force to the slider 20 to urge it toward the disk 16. The suspension may be a conventional type of suspension, such as the well-known Watrous suspension, as described in assignee's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals via cable 19.

Preferred Embodiment

Figure 3:
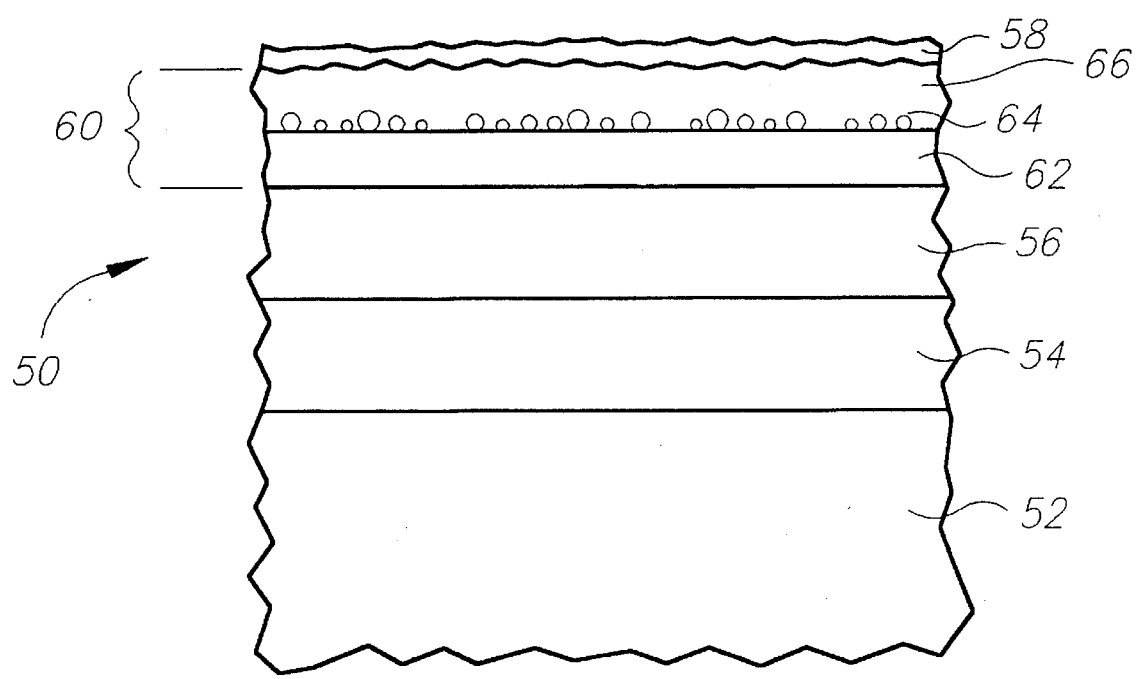
FIG. 3 is a view in section illustrating the layers forming the thin film disk according to the present invention.

The thin film disk 50 according to the present invention is illustrated in section in FIG. 3 and, when used in place of the prior art disk 16 shown in FIGS. 1 and 2, results in a disk drive with an improved head-disk interface. The disk 50 comprises a disk blank of a AlMg alloy (not shown) having a NiP surface coating 52, a Cr underlayer 54 formed on the NiP coating 52, a CoPtCr alloy magnetic layer 56 formed on the Cr underlayer 54, a protective overcoat 60 formed on the magnetic layer 56, and a lubricant film 58 on the protective overcoat 60. Underlayer 54 and magnetic layer 56 are typically formed by conventional sputter deposition. The disk overcoat 60, to be described in detail below, comprises a first overcoat layer 62, a transient liquid metal interlayer (TLMI) 64 of generally spherically-shaped grains of a metal or metal alloy, and a second top layer 66. The overcoat layers 62, 66 may be formed of any conventional disk overcoat material and need not be of the same material. However, in the preferred embodiment, the layers 62 and 66 are essentially amorphous carbon and the TLMI 64 is indium-niobium (In—Nb).

Several disks of the type shown in FIG. 3 with various types of TLMI layers were fabricated on smooth NiP substrates (average surface roughness $R_a$=5–10 Å) in a modified Kurt Lesker sputtering system. The disks had 200–300 Å Cr underlayers and 300–400 Å CoPtCr magnetic layers. As is common in the fabrication of thin film disks, the disk substrates were heated to approximately 200° C. during the deposition of the underlayers and magnetic layers in order to tailor the magnetic properties of the disks. Over the magnetic layers, amorphous carbon overcoats containing the TLMI layers were deposited in-situ in three steps. In the first step, initial 50–100 Å carbon layers were deposited over the magnetic layers. The purpose of the initial carbon layer is to make a nonwetting surface for the transient liquid metal. The term "nonwetting" means that the difference in surface energies between the surface and the TLMI material (and therefore the contact angle of the transient liquid) is relatively large.

Next, the TLMI layer was deposited over the first carbon layer. For a successful carbon overcoat, the TLMI material must be nonwetting, hard, durable, and easily deposited at manufacturable temperatures. The TLMI material may be any low-melting temperature metal or metal alloy with its melting temperature near or below the temperature of the substrate. Metals such as indium (In), gallium (Ga), silver (Ag), tin (Sn), aluminum (Al), gold (Au), bismuth (Bi), lead (Pb), cadmium (Cd), scandium (Sc), and tellurium (Te), or alloys of these metals with each other, will form discontinuous spheres when deposited on a nonwetting surface at temperatures above their melting temperature. In addition, with the use of alloys of these metals with higher melting point metals, such as cobalt (Co), niobium (Nb), titanium (Ti), vanadium (V), chromium (Cr), and tungsten (W), it is possible to form a transient liquid at a substrate temperature below the bulk melting point of the alloy. This is because of the small size (on the order of approximately 100 Å) of the transient liquid balls, which is below the critical nucleation size. Also, the transient liquid metal atoms are deposited with some kinetic energy which effectively raises the surface temperature of the substrate. In particular, nonwetting metal alloys, such as indium-niobium (In—Nb) or indium-chromium (In—Cr), are more durable than the pure metals and thus more suitable for withstanding an aggressive environment such as exists at the head-disk interface of a disk drive.

In the preferred embodiment, the TLMI was formed of In—Nb. Layers of In—Nb were deposited to thicknesses of 10–50 Å on the first carbon layers to form the TLMI layers. Indium and niobium are known to form many intermetallics at low temperatures (such as $In_2Nb_3$ at 140° C.).

On top of the In—Nb layers, the second carbon layers were deposited to thicknesses of 50–100 Å. Finally, the completed disks were lubricated by bonding about 10 Å of a conventional perfluoropolyether liquid lubricant to the carbon overcoats.

The term "transient" with reference to the TLMI refers to the temporary existence of the liquid metal layer. The deposition of the top or capping layer of sufficient quantity quenches or reacts with the liquid metal and results in the substantially complete disappearance of the liquid phase. As a result, there is no distinct liquid metal layer in the final overcoat, but rather an interlayer of discontinuous generally spherically-shaped grains of the TLMI material.

In the fabrication of the disks, all of the metal layers (including the In—Nb layer) were deposited using DC magnetron sputtering at a pressure of 6 mTorr. The substrates were heated to 175 (±25)°C. before deposition of the metal layers. The initial and top carbon layers were deposited using RF CVD with substrate bias (−400 Vdc) applied. The RF power was 300 watts and the gasses were c-pentane (4 sccm), argon (Ar) (2 sccm), and nitrogen (14 sccm). The total pressure during CVD was 33 mTorr. The hydrogen content of the carbon layers was 27 (±3) atomic percent and the nitrogen content was 4 (±1) atomic percent.

The disks as fabricated above and control disks (without the TLMI layers) were then tested for start/stop performance under identical conditions. The disk drives were commercially-available drives outfitted with sliders having carbon-coated rails. The pass/fail stiction condition for the start/stop measurements required that the maximum force exerted on the slider during the initial 60 ms after the disk drive motor start up be kept below 8 gm. However, different drives use different drive motors so this criteria can change with drive design. The standard CSS cycle consisted of a 0.17 minute rest period and a 0.10 minute flying period at a maximum rotational speed of 3600 rpm.

In addition to exhibiting acceptable stiction levels, the disks with carbon overcoats having TLMI layers were durable and corrosion resistant. Also, the total overcoat thickness, about 250 Å, is well within the range necessary to minimize the spacing between the read/write head and the magnetic layer on the disk (i.e., less than about 300 Å). The acceptable test results for a carbon overcoat of this relatively small thickness and yet with a TLMI intermediate layer is surprising since it was not expected that the thin first carbon layer (about 75 Å) would be both continuous and nonwetting. It was also not certain, prior to the test results, that the second top layer of carbon of only about 100 Å would be durable enough to protect the underlying relatively soft TLMI spheres.

Scanning electron microscope (SEM) and atomic force microscope (AFM) measurements were made on the tested disks to calculate the size, height, and density of the bumps on the carbon overcoat surface caused by the TLMI layers inside the carbon overcoats.

Table 1 lists the results of the CSS stiction tests and the bump size and distribution.

TABLE 1

| TEST DISKS (SET NUMBER) | 1 | 2 | 3 | 4 |
| --- | --- | --- | --- | --- |
| In—Nb Power Setting (Watts) | 0 | 90 | 120 | 150 |
| CSS Cycles (Truncated) | <100 | >5000 | >7500 | >3300 |
| CSS Stiction (grams) | >80 | 21 | 16 | 7 |
| Bump Ht. Distribution (A) | 0 | 18–44 | 11–23 | 13–18 |
| Bump Spacing (microns) | 0 | .3 | .45 | 1.45 |

Table 1 shows that the control disks without the TLMI texturing (TEST SET 1) failed very early (less than 100 CSS cycles with a CSS stiction of greater than 80 grams). All of the disks with the TLMI layers were truncated at CSS cycles greater than 3300 with CSS stiction values ranging from 7 gm to 21 gm, depending on the TLMI metal alloy deposition conditions. The spacing and size of the bumps in the carbon overcoat can be adjusted by changing the power setting applied to the In—Nb sputtering target. As shown in Table 1, the disks with bump height distribution of 13–18 Å and 1.45 micron spacing (TEST SET 4) give the lowest stiction value.

The population density of the TLMI grains affects the amount of stiction reduction. For a given sputtering condition, the density and distribution can be controlled by selection of the proper composition of the In—Nb alloy. When the Nb concentration is more than approximately 70 atomic percent, the density of the TLMI grains is reduced to approximately 80–100 per square micron. This low density will not generally support the load of the slider. In order to get a higher density of grains, i.e., in excess of 300 per square micron, the concentration of the Nb should be decreased. The optimum result has been determined experimentally to be when the concentration of Nb in the In—Nb alloy is in the range of approximately 30–50 atomic percent.

Figure 4:
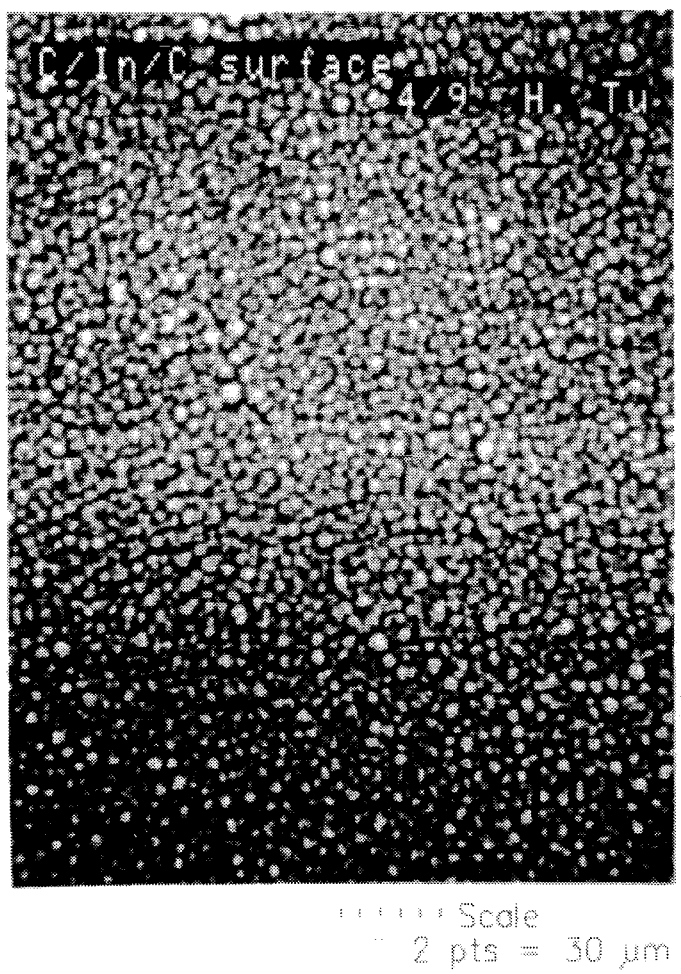
FIG. 4 is a scanning electron microscope (SEM) image of the surface topography of the thin film disk according to the present invention.

FIG. 4 illustrates the SEM micrograph of the carbon overcoat having a TLMI layer formed of In. The total carbon overcoat (below and above the TLMI) is about 175 Å, and the TLMI thickness is about 50 Å. The TLMI spheres embedded between the two carbon layers are responsible for the stiction reduction.

Figure 5:
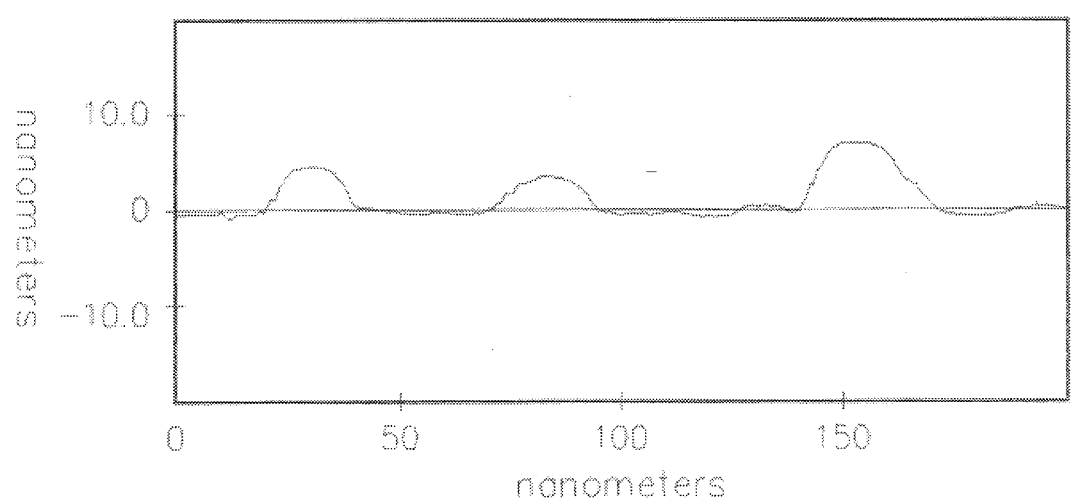
FIG. 5 is a computer-generated cross section of an atomic force microscope (AFM) micrograph of the surface topography of a thin film disk having a transient liquid metal interlayer.

FIG. 5 is a cross section of an AFM micrograph of a carbon overcoat having a TLMI layer deposited at 90 Watts. The total carbon thickness was about 175 Å with a 20–40 Å TLMI layer of In embedded between the first and second carbon layers. From this micrograph, the measured bump height distribution and spacing was found to be 18–44 Å and 0.3 microns, respectively. As FIG. 5 also illustrates, the bumps on the surface of the top carbon layer are generally rounded, indicating that the balls or grains forming the TLMI layer tend to retain their generally spherical shape after cooling and subsequent deposition of the top carbon layer. At higher sputter deposition power settings, the spacing between TLMI bumps increases and the bump height distribution becomes more uniform. This in turn directly affects the stiction and the disk drive performance. The measured stiction and stop/start performance changes with deposition conditions, which demonstrates that the carbon overcoats with TLMI layers can be optimized to provide the desired stiction performance for different disk drive designs.

Because the TLMI affects the texturing of only the protective overcoat on the disk, it does not adversely affect the magnetic properties of the disk. This allows the entire disk to have a textured surface, thus eliminating the need for a dedicated landing zone.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

What is claimed is:

1. A thin film magnetic recording disk comprising:

a rigid substrate;

an underlayer formed on the substrate;

a magnetic layer comprising a cobalt-based alloy formed on the underlayer; and an essentially amorphous carbon overcoat formed on the magnetic layer, the overcoat comprising a first essentially amorphous carbon layer deposited directly on and in contact with the magnetic layer, a plurality of discontinuous generally rounded grains of a metal or metal alloy deposited on the surface of the first carbon layer, the grains being formed of a metal or an alloy of a metal selected from the group consisting of indium (In), gallium (Ga), silver (Ag), tin (Sn), aluminum (Al), gold (Au), bismuth (Bi), lead (Pb), cadmium (Cd), scandium (Sc), and tellurium (Te), and a second essentially amorphous carbon layer formed on the first carbon layer and the metal or metal alloy grains.

2. A thin film disk according to claim 1 wherein the first or second essentially amorphous carbon layer includes an element selected from the group consisting of hydrogen and nitrogen.

3. A thin film disk according to claim 1 wherein the metal alloy forming the grains on the first carbon layer is an alloy formed of metals selected from the group consisting of indium (In), gallium (Ga), silver (Ag), tin (Sn), aluminum (Al), gold (Au), bismuth (Bi), lead (Pb), cadmium (Cd), scandium (Sc), and tellurium (Te).

4. A thin film disk according to claim 1 wherein the metal alloy forming the grains on the first carbon layer is an alloy formed of a metal selected from the group consisting of indium (In), gallium (Ga), silver (Ag), tin (Sn), aluminum (Al), gold (Au), bismuth (Bi), lead (Pb), cadmium (Cd), scandium (Sc), and tellurium (Te), and an element selected from the group consisting of cobalt (Co), niobium (Nb), titanium (Ti), vanadium (V), chromium (Cr), and tungsten (W).

5. A thin film disk according to claim 1 wherein the substrate is either an aluminum alloy disk having a NiP surface coating, or a glass disk.

6. A thin film disk according to claim 4 wherein the metal alloy is In—Cr or In—Nb.

7. A thin film disk according to claim 6 wherein the In—Nb alloy contains Nb in an amount between approximately 30 and 50 atomic percent.

8. An improved contact start/stop (CSS) magnetic recording rigid disk drive wherein the improvement comprises a thin film magnetic recording disk having a protective overcoat of essentially amorphous carbon, the overcoat comprising a first layer of essentially amorphous carbon deposited directly on and in contact with the magnetic layer, a plurality of discontinuous generally rounded metal or metal alloy grains deposited on the surface of the first carbon layer, the grains being formed of a metal or an alloy of a metal selected from the group consisting of indium (In), gallium (Ga), silver (Ag), tin (Sn), aluminum (Al), gold (Au), bismuth (Bi), lead (Pb), cadmium (Cd), scandium (Sc), and tellurium (Te), and a second essentially amorphous carbon layer formed over the first carbon layer and the metal or metal alloy grains, whereby the second carbon layer has a generally textured surface caused by the underlying metal or metal alloy grains.

* * * * *